United States Patent [19]

Nihart et al.

[11] Patent Number: 4,941,115
[45] Date of Patent: Jul. 10, 1990

[54] HAND-HELD TESTER FOR COMMUNICATIONS PORTS OF A DATA PROCESSOR

[75] Inventors: James D. Nihart; Samuel M. Prabhakar, both of Rochester, Minn.

[73] Assignee: International Business Machines Corporation, Armonk, N.Y.

[21] Appl. No.: 209,232

[22] Filed: Jun. 20, 1988

[51] Int. Cl.⁵ .......................... H04M 1/56; H04B 3/50
[52] U.S. Cl. ...................................... 364/580; 371/20.4; 371/22.1; 371/24; 371/16.5; 371/57.2
[58] Field of Search ....................... 364/200, 900, 580; 371/15, 20, 22, 24, 25

[56] References Cited

U.S. PATENT DOCUMENTS

| | | | |
|---|---|---|---|
| 4,246,442 | 1/1981 | Hashimoto | 371/24 |
| 4,498,716 | 2/1985 | Ward | 371/24 |
| 4,567,592 | 1/1986 | Minicilli | 371/20 |
| 4,581,738 | 4/1986 | Miller et al. | 371/25 |
| 4,620,282 | 10/1986 | Shelley | 364/580 |
| 4,622,647 | 11/1986 | Sagnard et al. | 364/580 |
| 4,628,511 | 12/1986 | Stitzlein et al. | 371/20 |
| 4,665,521 | 5/1987 | Smith | 371/22 |
| 4,697,138 | 9/1987 | Morishita et al. | 371/20 |
| 4,788,492 | 11/1988 | Schubert | 371/15 |

OTHER PUBLICATIONS

JDR Microdevices, "Mini-Tester", p. 12, winter 1987 catalog.
TEK Products 1988, "Data Communications Analyzers", p. 159 (#'s 834/835/836).

*Primary Examiner*—Parshotam S. Lall
*Assistant Examiner*—Christopher L. Makay

[57] ABSTRACT

A hand-held battery-powered instrument tests communications ports of a data-processing system by analyzing received data frames for multiple conditions, such as parity, poll commands, and violation sequences. Indicator lights show proper/improper operation of the port, and also indicate phase reversal of the lines.

12 Claims, 4 Drawing Sheets

HAND-HELD TESTER FOR COMMUNICATIONS PORTS OF A DATA PROCESSOR

BACKGROUND

The present invention relates to electronic data processing, and more particularly concerns a physically small test instrument for checking input/output ports and cables of a data-processing system.

Modern data-processing systems of the mid-range and mainframe varieties are connected to dozens or even hundreds of users simultaneously by means of terminals remote from the processor unit itself. "Remote" may range from a few meters to hundreds of meters for a terminal directly attached via baseband cable, or to hundreds or thousands of kilometers for terminals attached via communications facilities such as telephone lines or satellite links.

Attachments between terminals and their processing system are prone to failure. They use inherently flaky components such as wiring and connectors. The wiring frequently extends through building structures in locations which are difficult to inspect. The attachments are often modified and rearranged by users and other nonprofessionals.

Checking out the input/output (I/O) ports of a DP system has been difficult in the past because it involves checking both ends of long and hidden cables for continuity, attaching terminals and other I/O or peripheral devices to the central processor by alternate means, and other activities requiring large amounts of time and effort.

SUMMARY OF THE INVENTION

The present invention allows DP system peripheral attachments to be checked easily, even by people who are not DP professionals, without continuity checking of cables and other laborious activities. The invention provides a physically small and inexpensive instrument for checking I/O attachments and locating possible failing units in a precise way.

The invention achieves these and other objectives with an instrument in a hand-held housing containing connectors for attaching to data cables, receiver circuits, a synchronized clock at the cable data rate and phase, decoder circuits for detecting certain bit patterns in the data protocol of the cable and producing signals indicative of proper operation of the system up to the point of the tester, and at least one indicator for communicating such proper operation to a user.

These and other advantages of the tester, as well as modifications obvious to those skilled in the art, will become apparent from the following description of a preferred embodiment of a hand-held port tester according to the invention.

DRAWINGS

DESCRIPTION OF A PREFERRED EMBODIMENT

Figure 1:
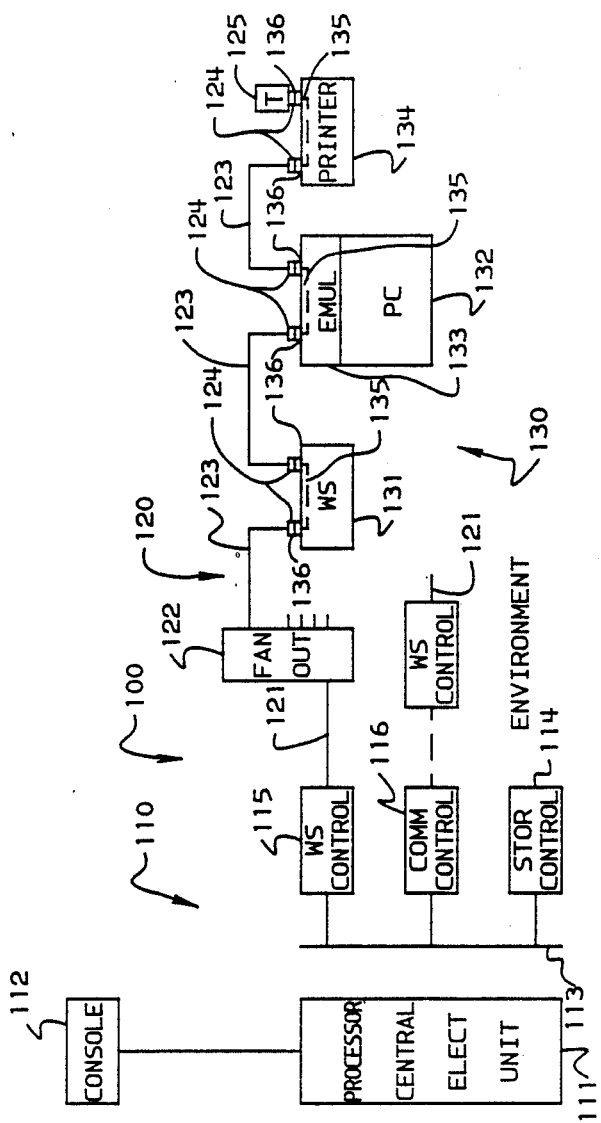
FIG. 1 is a high-level block diagram of a data-processing system showing the environment in which the invention finds utility.

FIG. 1 illustrates an environment in which the present invention finds utility. Conventional data-processing system 100 has a central electronic complex (CEC) 110 containing at least one processing unit or engine 111, a console terminal 112 for displaying messages to an operator and for receiving commands from the operator, and an input/output (I/O) bus or channel 113 for connecting controllers for peripheral devices. Such controllers commonly contain processors themselves, and supervise the transfer of data to and from multiple I/O devices. Storage controller 114, for example, may control multiple disk drives (not shown).

Another type of controller is a workstation controller (WSC) 115 for overseeing the transfer of data to and from multiple workstation terminals. Such a controller can be physically located within CEC 110, connected directly to bus 113, or it can be located at a remote place and connected to bus 113 by a conventional communications controller, as shown at 116.

Distribution system 120 distributes the data to and from WSC 115. Each WSC might manage a number of ports, each port being capable of attaching to a number of workstation terminals. In a typical installation, cable 121 carries six or eight pairs of wires to a conventional cable fan-out box 122. Separate cables such as 123 for each port emerge from box 122, and go their separate ways through a building. In this example, up to seven workstations can attach to one port in a multi-drop configuration.

Workstations 130 may include a conventional display terminal 131 such as an IBM 3180 terminal an intelligent terminal 132 such as an IBM PS/2 containing an emulator card 133, or a printer 134 such as an IBM 3812. Cable 123 may be a twinaxial cable or a telephone-style twisted-pair cable. Each section of the cable is coupled to its terminal(s) by removable connectors 124. The last terminal may have a terminator resistor 125 to avoid reflections along line 123. Internal wiring 135 within each terminal 130 couple together two connectors 136 associated with each terminal, and route the cable signals to the terminal circuitry without creating an impedance mismatch. Instead of being attached directly to processor 111, console 112 may be a designated workstation such as 131 or 132 attached to the system via a WS controller 115.

Figure 2:
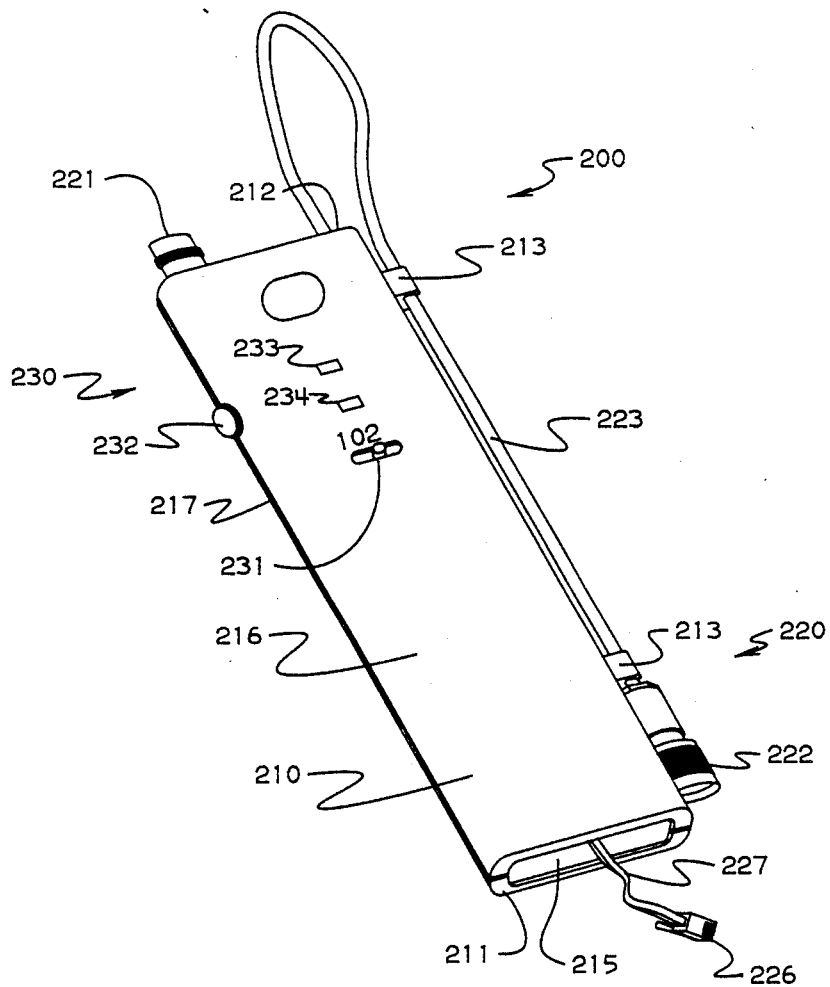
FIG. 2 shows a port tester according to the invention.
Figure 3:
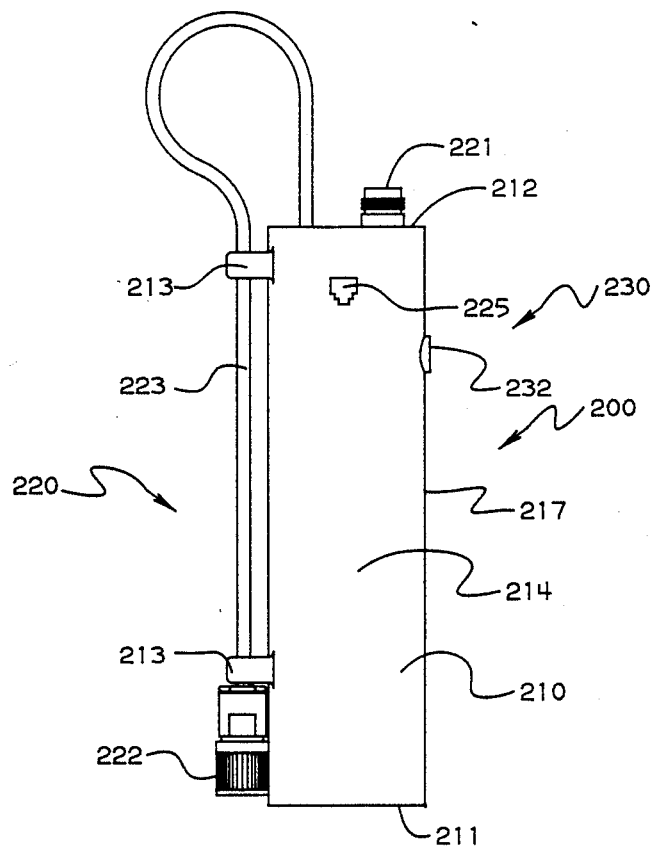
FIG. 3 is another view of the port tester of FIG. 2.

FIGS. 2 and 3 show a port tester 200 according to the invention. An oval cylindrical housing or casing 210 is sized to fit easily into the hand, preferably about 27 cm high, and about 6.5 cm by 4 cm at the base end 211. A tough, scuff-resistant plastic such as ABS is preferred. Conventional clamshell construction makes manufacture simple and inexpensive.

Electrical connectors 220 include an externally threaded female twinaxial connector 221 of a standard type, physically mounted on the top surface 212 of housing 210. (A twinaxial cable has two balanced signal conductors surrounded by insulation and a flexible conductive shield; the shield is electrically coupled to the shell of a connector.) An internally threaded male connector 222 is attached to a short twinaxial cable section 223 and extends through top surface 212 of the housing. The cable section is held in place on the housing by a pair of flexible plastic clips 213 which allow the cable section to be pulled outward, yet stowed easily against housing 210. The clips can be separate pieces, but are preferably formed integrally with housing 21C. A standard telephone RJ-11 jack 225 on the back 214 of housing 210 accepts a telephone twisted pair (TTP) data cable having a mating plug. (Twisted-pair lines have two unshielded signal conductors twisted about each other to reduce noise pickup from external sources.) A standard RJ-11 plug is attached to a short length of telephone-style handset cord extending into housing 210. A cavity 215 in the bottom of housing 210 allows the cord and plug to be coiled and stowed out of sight, as shown in FIG. 3.

Control and indicator group 230 are placed where they can be easily seen and operated while holding the tester 200 in one hand. A three-position test-selector switch 231 is easily visible on the front surface 216 of the housing. When the right hand grasps the instrument, the "Test" pushbutton 231, mounted on one side 216, falls naturally under the right thumb. At the same time, the indicator lights remain visible. A green light-emitting diode (LED) 233 and a yellow LED 234 indicate various test results.

Before using port tester 200 to check a system 100, self-test it by moving selector switch 231 to the position marked "0" in FIG. 2. If both the green and yellow LEDs 233 and 234 light up within two or three seconds, tester 200 is functioning correctly. You may self-test the unit at any time, since switch 231 uncouples all connectors 220 from the internal circuitry when it is in this position.

When a workstation on one of the cables 123, FIG. 1, fails, an error code appears on system console 112. In the IBM System/36 processor, for example, a System Reference Code with a message appears on the console screen. You have the option to perform a problem analyis and resolution (PAR) procedure yourself. First, disconnect cable 123 for the failing port at fanout box 122, and couple the appropriate connector 230 (twinaxial or TTP, male or female) to the fanout box connector. Move selector switch 231 to position "1" for twinaxial cables, or to position "2" for TTP wiring Depress the Test button 232 and hold it for at least twenty seconds (that is, until all terminals on the port have been polled by controller 115). Read the indicator LEDs as follows:

| Green | Yellow | Condition |
|---|---|---|
| ON | ON | Self-test checks out properly. |
| ON | OFF | System is operating properly between CEC 110 and the location of the port tester. |
| OFF | ON | Phase-reversal error; interchange the two conductors of the data cable 123. |
| OFF | OFF | System has failed between CEC 110 and the location of the tester on cable 123. |

If both LEDs light up, reconnect the cable 123 to fanout box 122. Then disconnect the other end of this cable section at terminal 131, and couple the port tester to connector 124 at this terminal. Repeat the test and continue at each end of the cable sections until you find the fault.

For more sophisticated checking, written instructions or on-line directions on system 100 itself can be provided.

Figure 4:
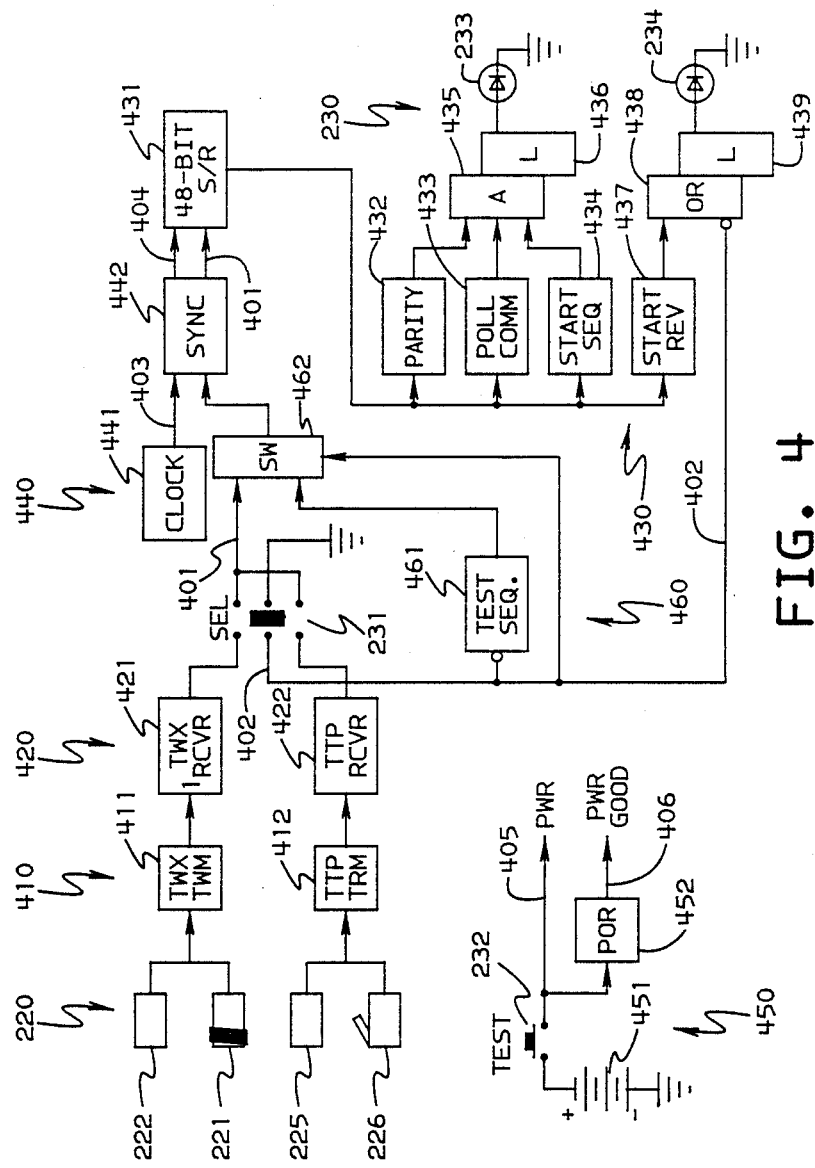
FIG. 4 is a diagram of the circuitry contained in the port tester of FIGS. 2 and 3.

FIG. 4 shows the circuitry 400 of the port tester. Terminators 410 provide an impedance match for connectors 220 in a conventional manner, so that the tester does not produce signal reflections back into the cable 123, FIG. 1. Twinaxial connectors 221 and 222 are tied together and coupled to a terminal 411 having a balun with the characteristic impedance of a twinaxial line. TTP connectors 225 and 226 are similarly coupled to each other and to a terminator having a balun selected for the impedance of this line; this terminator may also include a conventional low-pass filter.

Receiver circuits 420 convert the raw signals from connectors 220 into clean data-signal inputs 421 and 422 having the proper voltages and shapes for the subsequent digital circuits. This is done in a conventional manner identical to that which would be appropriate for receiving the signals in a workstation terminal such as 131, FIG. 1. Receiver 423 converts the twinaxial voltage from connector 221 or 222 to a 0/+5 volt logic signal. It also contains a standard threshold function for shaping the distorted input signal into logic pulses having fast transition times. Receiver 424 performs the same operations for converting the degraded TTP input signals from connector 225 or 226 into 0/+5 volt logic signals.

Test-selector switch 231 is a three-pole slide switch for connecting either the twinax data input 421 or the TTP data input 422 to an input 401 of a decoder 430. In its center position, switch 231 grounds decoder input 402 for self-test mode.

Clock circuits 440 provide a train of clock pulses at the frequency and phase of the data bits transmitted through cable 123 by workstation controller 115, FIG. 1. Crystal oscillator 441 generates the clock pulses at the data frequency (2 MHz) and at a higher frequency (16 MHz). To align the clock-signal transitions with the transitions in the data input 401, synchronizer 442 time-shifts the transitions of the raw clock signal 403 to match those of data input 401. This is a conventional function commonly performed in UART (universal asynchronous receiver/transmitter) integrated circuits, for example. Synchronized clock signal 404 thus matches the data input signal in both frequency and phase, and defines time slots or windows for timing the data bits in the signal from cable 123.

Power supply 450 for the hand-held port tester includes an internal lithium battery 451. Such a battery has a very long shelf life (about ten years), and can provide about 750 test cycles in this application. The battery is replaceable. Circuit 400 eliminates a requirement for a separate power switch, which would add expense and could drain the battery if it were inadvertently left on. Instead, Test button 232 applies power to all the tester circuits, as indicated at line 405. In order to avoid glitches as the power comes up, a conventional power-on reset circuit 4 supplies a power-good logic signal 461 to the other circuits.

Decoder 430 analyzes the incoming data stream over cable 123 to detect a number of different bit sequences indicating proper operation or error conditions. The data protocol used by this particular embodiment transmits commands and data in messages comprising groups of sixteen-bit frames, encoded in a standard bi-phase or phase-modulated code. Each bit cell is one microsecond long. The data signal remains at a high level when no frames are being transmitted. The beginning of a message comprises a "quiesce" sequence of five One bits (0.5 usec high level followed by 0.5 usec of low level)

and a "code violation" sequence (1.5 usec high then 1.5 usec low). Each frame has a parity bit. One of the commands in the protocol is a Poll command, which requests a terminal at a particular address (0-7) on the port to identify itself by returning a particular message. Poll is a convenient frame to use for testing, because the protocol requires controller 115 to poll the addresses belonging to all addresses on a port at intervals of less than ten seconds. Thus, even if the port has no active terminals, controller 115 is known to transmit a Poll command at least every ten seconds or so. This provides a known bit sequence whose presence can be interpreted that at least the physical cable is intact. The form of a Poll command is:

100001XX0XXXP000 where the group of three Xs represents the terminal address being polled. P is a parity bit.

Clock signal 404 clocks data from input 401 through a 48-bit shift register 431. Parity checker 432 produces a parity signal if the parity of the frame is correct. At the same time, comparator 433 produces a poll-detect signal when a Poll command is detected in shift register 431. Comparator 434 detects a message-start sequence (quiese/code-violation). AND gate 435 lights the green LED 233 when all three of these conditions have occurred, indicating proper operation of the port. Latch 436 holds this indicator LED on until the Test button 232 is released.

Another comparator, 437, detects the start sequence, but having all bit polarities inverted. This pattern indicates that the data conductors of cable 123 are reversed, and lights the yellow LED 234, via OR gate 438. Latch 439 holds this LED on until the Test button 231 is released.

Self-test logic 460 engages when selector switch 231 grounds line 402. Test-sequence generator 461 responds to (inverted) line 402 to produce a valid start sequence followed by a poll command having correct parity. Switch logic 462 responds to line 402 to gate this sequence into the shift register 431 instead of the external data signal. This sequence should light LED 233 if the tester is operating properly. The self-test signal 402 also passes through an inverting input of OR 438 to light yellow LED 234.

Having described a preferred embodiment thereof, we claim as our invention:

1. A hand-held port tester for testing input/output ports of a data-processing system, said ports having cables for attaching said system to input/output devices, said cables carrying a first signal being propagated at a first rate for communicating with said devices, wherein said first signal comprises at least one multi-bit code, said port tester comprising:
   (a) housing means having a size and shape adapted to be carried in one hand;
   (b) connector means, including cable coupling means, attached to said housing means;
   (c) receiver means, coupled to said connector means, for converting said first signal to a second signal;
   (d) clock means for producing a clock signal that is synchronized with the rate of said first signal;
   (e) decoder means, located within said housing and outside the system under test, coupled to said clock means and to said receiver means, for utilizing said second signal to detect the presence and integrity of said at least one multi-bit code;
   (f) indicator means, mounted on said housing and responsive to said decoder means, for signalling a fault unless both the presence and integrity of said at least one multi-bit code is detected by said decoder means, and for otherwise signalling a successful test; and
   (g) power means mounted in said housing for providing power to all the above means.

2. The port tester of claim 1 wherein said decoder means detects a plurality of conditions of said first signal, wherein said plurality of conditions may be used to determine the integrity of said at least one multi-bit code, and wherein said indicator means signals a successful test only after the integrity of said at least one multi-bit code is determined utilizing all of said plurality of conditions.

3. The port tester of claim 2 wherein one of said conditions is a correct parity of said signals.

4. The port tester of claim 2 wherein one of said conditions is a start sequence for a message.

5. The port test of claim 1 wherein said cable coupling means, included in said connector means, further comprises a plurality of couplers, each of which may be used for coupling to a different type of cable.

6. The port tester of claim 5 wherein said connector means includes both male and female connectors coupled to each other and to said receiver means.

7. The port tester of claim 5 wherein said cabling coupling means, included in said connector means, further comprises a plurality of couplers, each of which may be used for coupling to a different type of cable, and wherein said receiver means includes a plurality of receiver circuits each having an input coupled to one of said plurality of couplers, wherein each of said plurality of receiver circuits has an output.

8. The port tester of claim 7 further comprising a selector switch mounted on said housing for selectively coupling the output of said receiver circuits to said decoder means.

9. The port tester of claim 1 further including self-test means.

10. The port tester of claim 1 further including a test bottom, coupled to said power means, mounted on said housing, for controlling the power provided by said power means.

11. The port tester of claim 1 wherein said decoder means includes a detector for a reversed polarity of said signals, and wherein said indicator means includes a separate indicator for producing an indication of said reversed polarity.

12. The port tester of claim 1 wherein said clock means includes a synchronizer for matching the phase of said clock signal to said cable signals.

* * * * *